(12) United States Patent
Chang

(10) Patent No.: US 9,287,150 B2
(45) Date of Patent: Mar. 15, 2016

(54) RETICLE TRANSFER SYSTEM AND METHOD

(71) Applicant: Taiwan Semiconductor Manufacturing Company, Ltd., Hsin-Chu (TW)

(72) Inventor: Ching-Jung Chang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 658 days.

(21) Appl. No.: 13/648,034

(22) Filed: Oct. 9, 2012

(65) Prior Publication Data

US 2014/0098354 A1  Apr. 10, 2014

(51) Int. Cl.
*G03B 27/42* (2006.01)
*H01L 21/677* (2006.01)
*H01L 21/67* (2006.01)

(52) U.S. Cl.
CPC .... *H01L 21/67733* (2013.01); *H01L 21/67225* (2013.01); *H01L 21/67727* (2013.01); *H01L 21/67769* (2013.01)

(58) Field of Classification Search
CPC .............. H01L 21/67225; H01L 21/67727; H01L 21/67733; H01L 21/67769
USPC .......................................................... 355/53
See application file for complete search history.

(56) References Cited

U.S. PATENT DOCUMENTS

| | | | |
|---|---|---|---|
| 6,726,429 B2 | 4/2004 | Sackett et al. | |
| 2003/0031539 A1 | 2/2003 | Nulman et al. | |
| 2003/0113189 A1* | 6/2003 | Kaji et al. | 414/217 |
| 2003/0168313 A1 | 9/2003 | Hiroki | |
| 2006/0182532 A1* | 8/2006 | Okada et al. | 414/217 |
| 2008/0217278 A1* | 9/2008 | Murata | 212/224 |
| 2008/0299684 A1 | 12/2008 | Rothe et al. | |

FOREIGN PATENT DOCUMENTS

JP  2004227060 A  8/2004
JP  2010028090 A  2/2010

* cited by examiner

*Primary Examiner* — Peter B Kim
(74) *Attorney, Agent, or Firm* — Slater & Matsil, L.L.P.

(57) ABSTRACT

A fabrication system comprises a global system comprising a plurality of stockers and a global transportation system connected to the stockers, a local system coupled to the global system through the global transportation system, wherein the local system comprises a first buffer located at a boundary between the global system and the local system, a plurality of lithography apparatuses coupled to the first buffer through a local transportation system and an empty pod buffer.

17 Claims, 4 Drawing Sheets

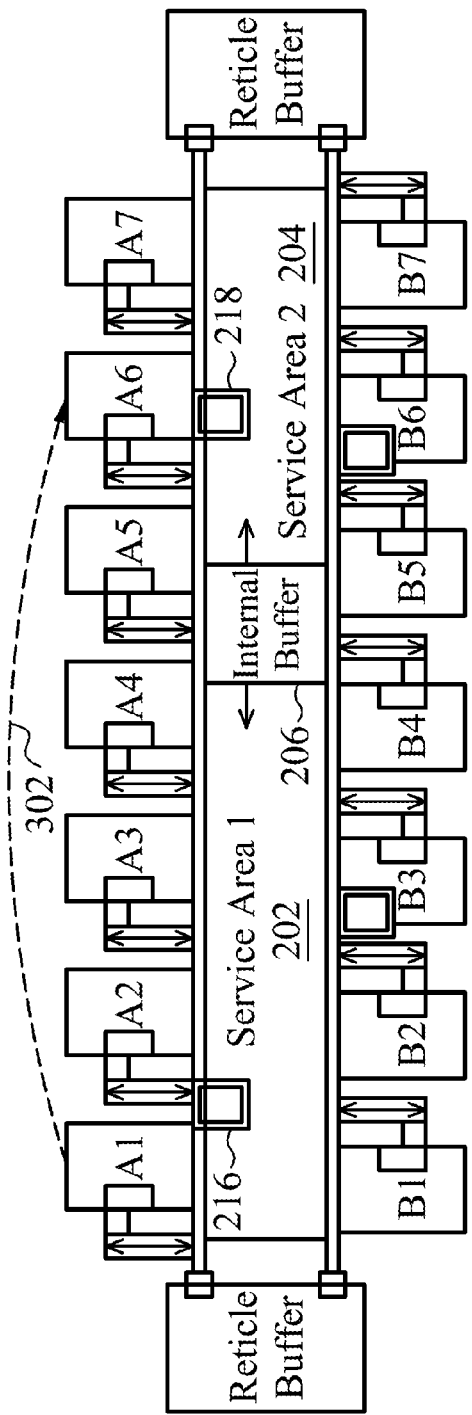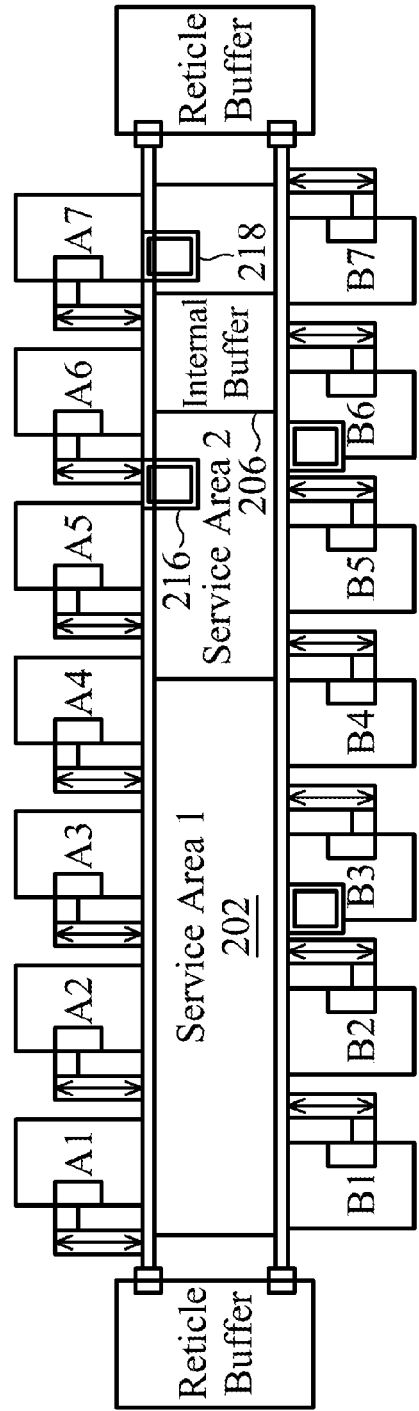
Figure 3A
Figure 3B

RETICLE TRANSFER SYSTEM AND METHOD

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next. Device complexity is increasing as manufacturers design smaller feature sizes and more functionality into integrated circuits. Such complex devices may result in more lithography steps.

As semiconductor technologies evolve, advanced lithography techniques have been widely used in today's integrated circuit fabrication processes. Photolithographic techniques involves forming a photoresist layer over a substrate, exposing portions of the photoresist material to a pattern of light in accordance with a desired pattern, developing the photoresist material to remove portions of the photoresist material to expose portions of the underlying material. A suitable etching process such as dry etching, wet etching and/or the like may then be performed on the substrate. As a result, the exposed underlying material may be removed in accordance with the desired pattern.

The exposure step of the lithography process may involve a variety of reticles (a.k.a. photo masks). Each reticle is a quartz plate having transparent and opaque regions. The transparent and opaque regions replicate a pattern representing an integrated circuit component on the surface of a wafer. The lithography process of the integrated circuit may comprise multiple photolithography process steps due to the complexity of the manufacturing process. Each lithography step may employ a reticle through which the pattern of a component of an integrated circuit is generated.

An integrated circuit fab may comprise a variety of lithography apparatuses such as steppers, immersion scanners and the like. In addition, the fab may have a plurality of stockers for storing wafers and reticles. The factory is automated by using automatic guided vehicles to transport wafers and reticles and using robots to load wafers and reticles into lithography apparatuses.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 3A illustrates a layout of the local system prior to moving the internal buffer in accordance with an embodiment;

FIG. 3B illustrates a layout of the local system after moving the internal buffer in accordance with an embodiment.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a reticle transportation system. The embodiments of the disclosure may also be applied, however, to a variety of transportation systems of an integrated circuit fab. For example, the method described below may be applicable to a wafer transportation system in the fab. More particularly, the method may be applied to a wafer transfer management system including moving a front opening unified pod (FOUP) from a location to another location in the fab. Hereinafter, various embodiments will be explained in detail with reference to the accompanying drawings.

Figure 1:
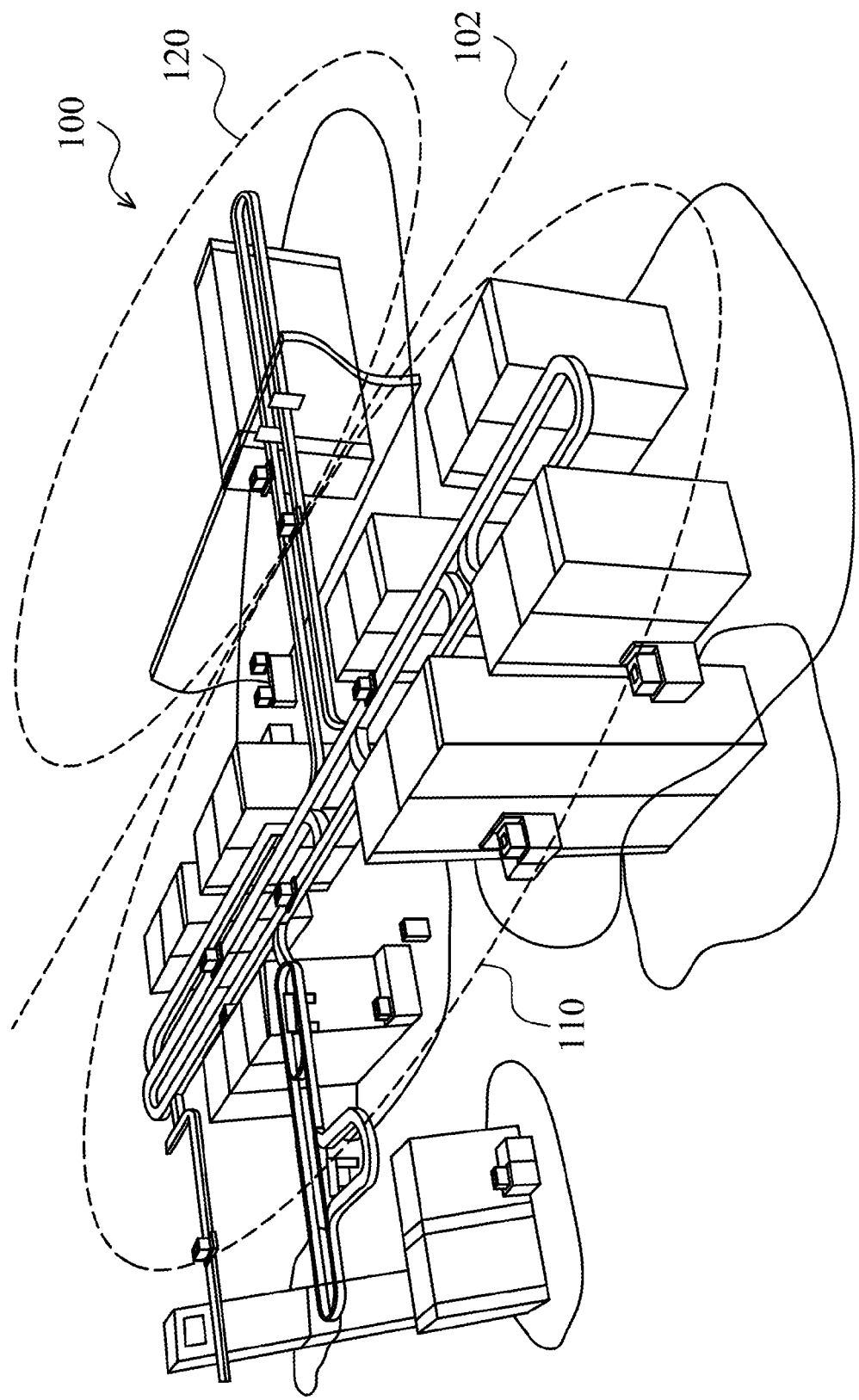
FIG. 1 illustrates a layout of an integrated circuit fab in accordance with an embodiment.

FIG. 1 illustrates a layout of an integrated circuit fab in accordance with an embodiment. For simplicity, only relevant portions of an integrated circuit fab are included in the layout 100. One person skilled in the art will recognize that FIG. 1 is a simplified diagram illustrating the operation of transporting wafers and reticles between different locations according to an embodiment. This diagram is merely an example, which should not unduly limit the scope of the claims. One of ordinary skill in the art would recognize many variations, alternatives, and modifications.

In accordance with an embodiment, an integrated circuit fab may comprise a main aisle and a plurality of bays connected to the main aisle. A plurality of stockers may be placed at either side of the main aisle. An overhead transportation system over the main aisle may transport reticles and wafers from one stocker to another stocker. Alternatively, a rail system at ground level may be used to fulfill the same transportation function.

Each bay may comprise a variety of lithography apparatuses, which are employed to fulfill different functions of a lithography process. The transportation through the main aisle is commonly referred to as inter-bay transportation. On the other hand, the transportation within a single bay is commonly referred to as intra-bay transportation.

According to different transportation characteristics, the layout 100 may be divided into two regions, namely a global system 110 and a local system 120. As shown in FIG. 1, the global system 110 and the local system 120 are demarcated by a dashed line 102. In accordance with an embodiment, the global system 110 may comprise a main aisle, a rail transportation system (a.k.a. a global transportation system) and a plurality of stockers used for storing wafers and reticles. The stockers may be a clean environment closet full of inert gas. A reticle and/or wafer may be stored in the stocker when the reticle and/or wafer are not processed. On the other hand, the reticle and/or the wafer may be retrieved from the stocker if the reticle and/or wafer will be used by a lithography apparatus.

As shown in FIG. 1, the stockers of the global system 110 are coupled to each other through the global transportation system. The global transportation system may include a variety of overhead rails and carriers (a.k.a. automatic guided vehicles). A wafer or a reticle may be loaded into a carrier from a stocker by a robot. Furthermore, the wafer or the reticle may be transported to another stocker in the global system 110 or an input terminal of the local system 120.

It should be noted that the container carrying reticles may be different from the container carrying wafers. In accordance with an embodiment, the reticle container may be a reticle storage pod (RSP). On the other hand, the wafer container may be a front opening unified pod (FOUP).

The local system 120 is coupled to the global system 110 through at least one overhead rail. There may be a buffer located at the boundary between the local system 120 and the global system 110. A wafer or a reticle may be temporarily stored at the buffer when the overhead rail coupled to the buffer is jammed or the destination apparatus of the local system 120 is not available.

The local system 120 may comprise a variety of lithography apparatuses such as immersion scanners, stepper and/or the like. All lithography apparatuses are coupled to each other through a local transportation system. The local transportation system may include a variety of overhead rails and carriers. A wafer, a reticle, a group of wafers carried by a pod such as FOUP may be loaded into/from a scanner from/into a carrier by a robot such as a 3-axis reticle handling arm. Furthermore, the wafer or the reticle may be transported to another scanner or to the global system through the overhead rail of the local transportation system. The detailed layout of the local system 120 will be described below with respect to FIG. 2.

One advantageous feature of dividing a fab layout into a global system and a local system is that the local system may be of an independent transportation system. As such, the system shown in FIG. 1 can avoid some common issues of the close-loop transportation system of a fab. For example, in order to short the response time, the close-loop transportation may employ many carriers cycling in loop to keep a short response time and need a dedicated loop for each scanner. Furthermore, the system may need a variety of rails between stockers and scanners to solve the traffic jam issue. By employing the layout shown in FIG. 1, the traffic between the global system and the local system has been reduced. As such, the traffic jam between the global system and the local system may be alleviated. Therefore, few carriers are needed so that the production cycle time and tool efficiency may be improved.

Figure 2:
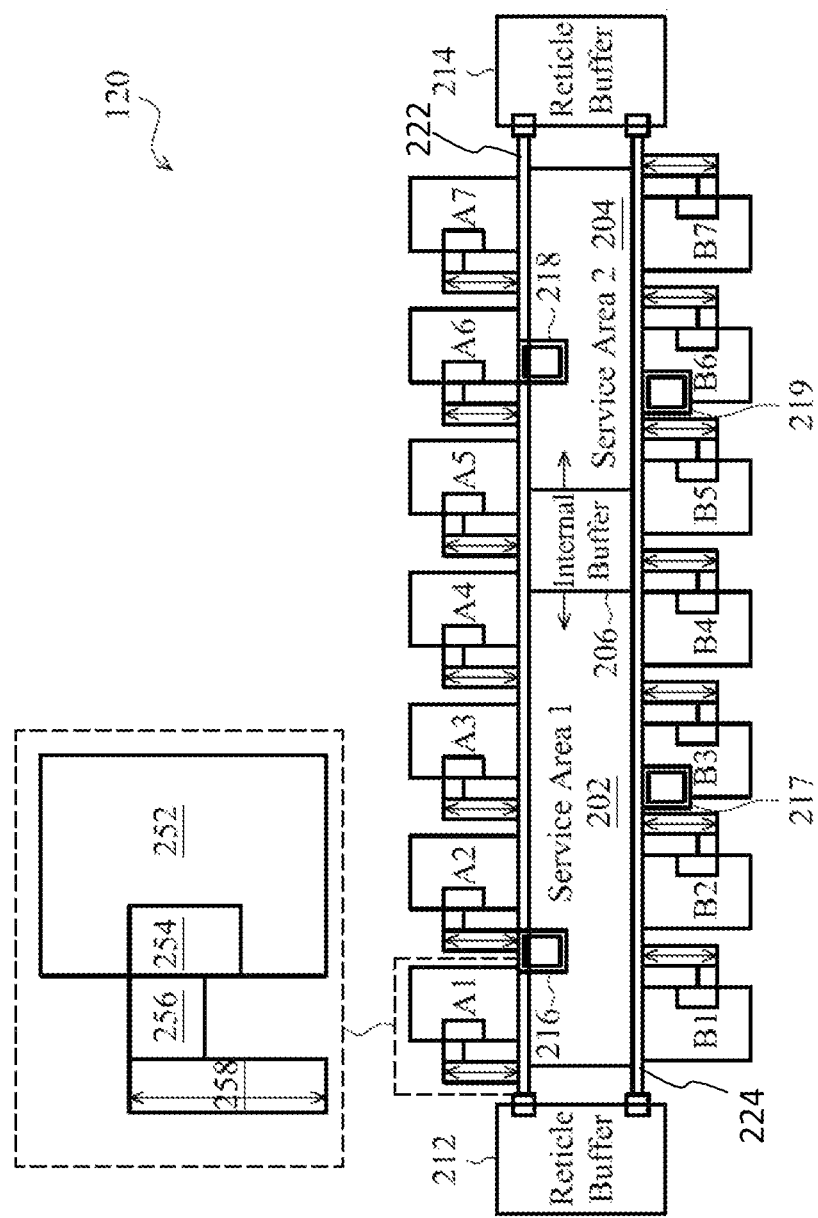
FIG. 2 illustrates a simplified layout of the local system of an integrated circuit fab in accordance with an embodiment.

FIG. 2 illustrates a simplified layout of the local system of an integrated circuit fab in accordance with an embodiment. The local system 120 may comprise a plurality of lithography apparatuses such as scanners. The scanners reside along two sides of a local aisle. As shown in FIG. 2, scanners A1, A2, A3, A4, A5, A6 and A7 reside at a first side of the local aisle. Scanners B1, B2, B3, B4, B5, B6 and B7 reside at a second side of the local aisle. There may be a transportation system located over the local aisle. The transportation system may include two rails, namely a first rail 222 and a second rail 224. As shown in FIG. 2, the first rail 222 provides reticle/wafer transportation for the scanners A1, A2, A3, A4, A5, A6 and A7. Likewise, the second rail 224 provides reticle/wafer transportation for the scanners B1, B2, B3, B4, B5, B6 and B7.

It should be noted that depending on different applications and constraints, the rails may be built at ground level. Alternatively, an overhead rail system may be employed to save ground level space. It should further be noted while the system and method described below may be applicable to both reticles and wafers, a reticle transfer system is used as an example to illustrate the innovative aspects of various embodiments.

Each scanner such as A1 may include a scanner apparatus 252 and a reticle port 254 embedded in the scanner apparatus 252. In particular, the reticle port 254 may be a loading platform located in the scanner and adjacent to a process chamber of the scanner apparatus 252. A conveyor 258 couples the scanner apparatus 252 with the local transportation system. More particularly, as shown in FIG. 2, when a reticle is transported from the local transportation system to the scanner apparatus 252 through the conveyor 258, a robot 256 loads the reticle into the reticle port 254. On the other hand, when a reticle is not processed, the reticle is loaded into the reticle port 254 from the scanner apparatus 252. The robot 256 further loads the reticle into the conveyor 258 from the reticle port 254. In accordance with an embodiment, the robot 256 may be a 3-axis reticle handling arm. It should be noted that scanners can be employed to store reticles. In some embodiments, a scanner can accommodate 6 to 8 reticles.

There may be two reticle buffers 212 and 214 in the local system 120. The reticle buffers 212 and 214 are coupled to both the first rail 222 and the second rail 224. As shown in FIG. 2, the first reticle buffer 212 and the second reticle buffer 214 are on opposite sides of the local aisle. One of the reticle buffers (e.g., reticle buffer 212) may function as a buffer between the global system 110 and the local system 120. The reticle buffer 212 may be alternatively referred to as a first buffer. The region where the global system 110 is located may be alternatively referred to as a first region. The region where the local system 120 is located may be alternatively referred to as a second region.

In addition, the reticle buffers 212 and 214 may be used to store empty pods including FOUP, RSP and/or the like. More particularly, a pod such as RSP is a closed container. The closed container may carry one reticle. When a reticle is loaded into its corresponding scanner apparatus, the empty pod may be transported to a stocker according to a conventional factory automation mechanism. Such a long distance transfer may cause a traffic jam, which in turn delays the response time of loading/unloading reticles. Storing empty pods in the reticle buffers 212 and 214 may reduce long distance transportation. As a result, the traffic jam issue of the system can be alleviated.

It should be noted that storing empty pods in the reticle buffers 212 and 214 is merely an example, which should not unduly limit the scope of the claims. One of ordinary skill in the art would recognize many variations, alternatives, and modifications. For example, in a fab having an overhead rail transportation system in the local system, the empty pods may be stored at an overhead storage area adjacent to the overhead rail.

In consideration with the location of lithography apparatuses, the local system 120 may be divided into two service areas. The first service area 202 extends from the first reticle buffer 212 to the conveyor of the scanner A5. The second service area 204 extends from the conveyor of the scanner A5 to the second reticle buffer 214. There may be two carriers (a.k.a vehicles) 216 and 217 dedicated to the first service area 202. Likewise, carriers 218 and 219 are employed to transport reticle within the second service area 204. It should be noted the definition of the first service area and the second service area is not fixed. The territory of each service area may change by adjusting an internal buffer. The detailed operation of the internal buffer will be described below.

It should be recognized that while FIG. 2 illustrates the local system 120 with fourteen scanners and two service areas, the local system 120 could accommodate any number of scanners and service areas. The number of scanners and service areas illustrated herein is limited solely for the purpose of clearly illustrating the inventive aspects of the various embodiments. The present disclosure is not limited to any specific number of scanners and service areas.

The local system 120 may further comprise an internal buffer 206 located between the first reticle buffer 212 and the second reticle buffer 214. More particularly, the internal buffer 206 is a movable component. The default position of the internal buffer 206 is at the boundary of the first service area 202 and the second service area 204. In consideration with the need of transporting reticles efficiently, the location of the internal buffer 206 may change accordingly. The detailed operation of the internal buffer 206 will be described below with respect to FIG. 3 and FIG. 4.

One advantageous feature of having the local system layout shown in FIG. 2 is that the adjustable internal buffer helps to improve the scanner productivity so that the total cost of manufacturing integrated circuits can be reduced.

FIG. 3A illustrates a layout of the local system prior to moving the internal buffer in accordance with an embodiment. As indicated by a dashed curve 302, a reticle will be transported from the scanner A1 to the scanner A6. A system controller (not shown) may check the activities of both service areas before adjusting the location of the internal buffer 206. In accordance with an embodiment, the second service area is idle. In other words, there is no reticle transportation in the second service area. The system controller may move the internal buffer 206 from its default point scanner A5's conveyer to a location beyond the scanner A6 so that the carrier 216 may deliver the reticle to the scanner A5 directly.

FIG. 3B illustrates a layout of the local system after moving the internal buffer in accordance with an embodiment. The internal buffer 206 has been moved to the location adjacent to the conveyor of the scanner A7. As a result, the carrier 216 may deliver the reticle to the conveyor of the scanner A6 directly. One advantageous feature of having adjustable internal buffer is that the internal buffer stage may be bypassed so that the time of moving a reticle may be reduced.

Figure 4:
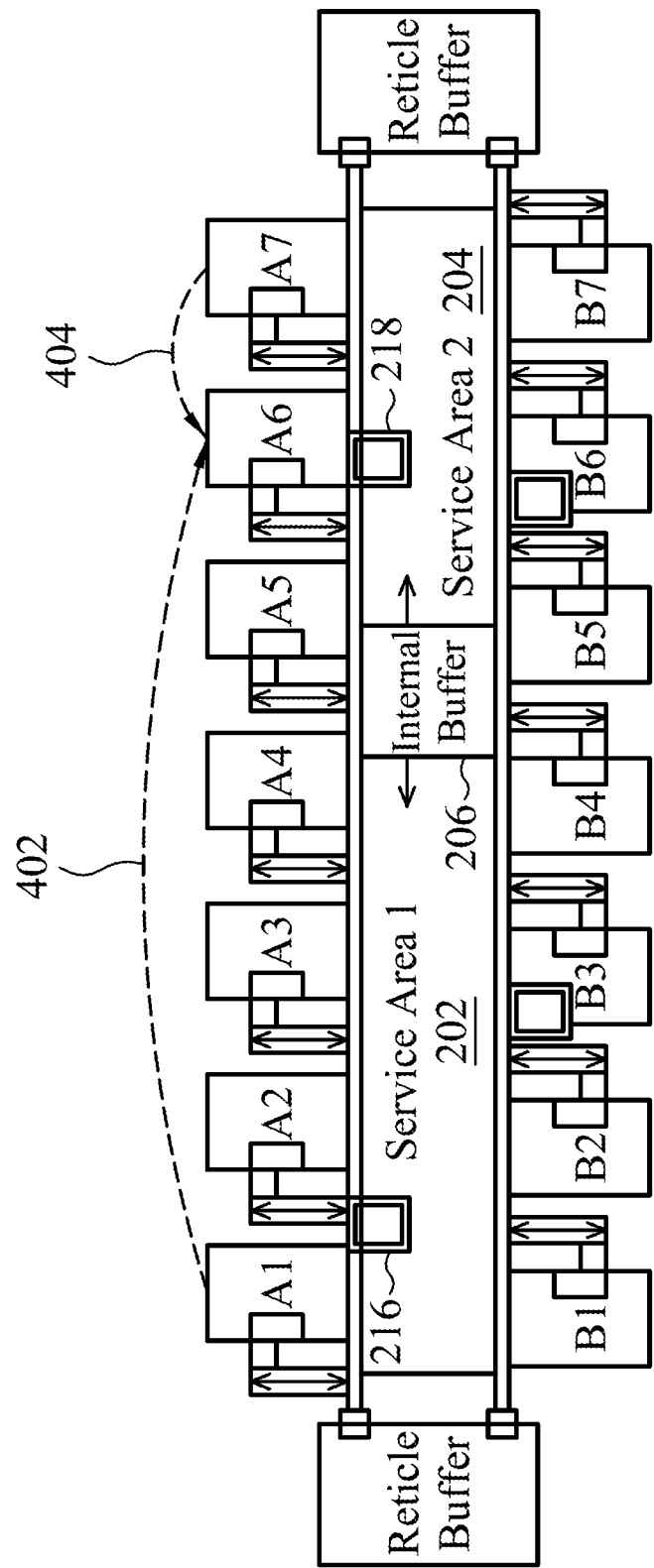
FIG. 4 illustrates a layout of the local system in accordance with another embodiment.

FIG. 4 illustrates a layout of the local system in accordance with another embodiment. As indicated by dashed curves 402 and 404, a first reticle will be transported from the scanner A1 to the scanner A6. At the same time, a second reticle will be transported from the scanner A7 to the scanner A6. As a result, there is conflict between these two reticle moving events. In consideration with this conflict, the system controller may not adjust the location of the internal buffer 206. The second reticle will be transported to the scanner A6 by the carrier 218. The first reticle will be transported to the internal buffer 206 by the carrier 216. After the carrier 218 is available, the first reticle is loaded into the carrier 218 and transported to the scanner A6 subsequently.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, apparatuses, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. A fabrication system comprising:
   a global system comprising a plurality of stockers and a global transportation system connected to the stockers;
   a local system coupled to the global system through the global transportation system, wherein the local system comprises:
   a first buffer located at a boundary between the global system and the local system;
   a plurality of lithography apparatuses coupled to the first buffer through a local transportation system;
   an aisle, wherein a first terminal of the aisle is connected to the first buffer;
   a first rail coupled between the first buffer and a first group of lithography apparatuses;
   a second rail coupled between the first buffer and a second group of lithography apparatuses, wherein the first group of lithography apparatuses and the second group of lithography apparatuses are on opposite sides of the aisle;
   a second buffer connected to a second terminal of the aisle;
   an internal buffer located between the first buffer and the second buffer, wherein the internal buffer is adjustable; and
   an empty pod buffer.

2. The fabrication system of claim 1, wherein:
   the global transportation system includes a plurality of rail loops connected between the plurality of stockers and the local system.

3. The fabrication system of claim 1, wherein the lithography apparatus is a scanner.

4. The fabrication system of claim 1, further comprising:
   a conveyor coupled between the local transportation system and the lithography apparatus;
   a robot configured to move a reticle between the conveyor and the lithography apparatus; and
   a reticle port embedded in the lithography apparatus, wherein the robot is coupled between the reticle port and the conveyor.

5. The fabrication system of claim 4, wherein:
   the robot is a 3-axis reticle handling arm.

6. The fabrication system of claim 1, further comprising:
   a first service area located from the first buffer to the internal buffer; and
   a second service area located from the internal buffer to the second buffer.

7. The fabrication system of claim 6, further comprising:
   a first carrier on the first rail, wherein the first carrier is located in the first service area;
   a second carrier on the first rail, wherein the second carrier is located in the second service area;
   a third carrier on the second rail, wherein the third carrier is located in the first service area; and
   a fourth carrier on the second rail, wherein the fourth carrier is located in the second service area.

8. The fabrication system of claim 1, wherein:
   the empty pod buffer is located at an overhead region.

9. The fabrication system of claim 1, wherein:
   the empty pod buffer is located at the first buffer.

10. A system comprising:
a plurality of stockers configured to store reticles, wherein the stockers are located in a first region comprising:
   a first transportation system configured to move the reticles between different stockers;
a plurality of lithography apparatuses in a second region, wherein the second region is connected to the first transportation system through a first buffer;
a second transportation system in the second region, wherein the second transportation system is connected to the first buffer and the plurality of lithography apparatuses, wherein the second transportation system comprises:
   a first service area configured to serve a first group of lithography apparatuses;
   a second service area configured to serve a second group of lithography apparatuses; and
   an internal buffer located a boundary between the first service area and the second service area;
   an aisle, wherein a first terminal of the aisle is connected to the first buffer;
   a first rail coupled between the first buffer and a first group of lithography apparatuses;
   a second rail coupled between the first buffer and a second group of lithography apparatuses, wherein the first group of lithography apparatuses and the second group of lithography apparatuses are on opposite sides of the aisle;
   a second buffer connected to a second terminal of the aisle; and
an empty pod buffer.

11. The system of claim 10, wherein:
the first system is a global system configured to carry long distance transportation.

12. The system of claim 10, wherein:
the second system is a local system.

13. The system of claim 10, wherein:
the internal buffer is an adjustable buffer.

14. The system of claim 10, wherein:
the lithography apparatus is a scanner.

15. A system comprising:
a global system comprising a main aisle, a plurality of stockers placed along the main aisle and a global transportation system connected to the plurality of stockers; and
a local system connected to the global system through the global transportation system, wherein the local system comprises:
   a first buffer located at a boundary between the global system and the local system;
   a local transportation system having a first terminal connected to the first buffer;
   a plurality of lithography apparatuses connected to the local transportation system;
   a second buffer connected to a second terminal of the local transportation system; and
   a local aisle in the local system, wherein the lithography apparatuses include a first group placed on a first side of the local aisle and a second group placed on a second side of the local aisle, and wherein the local transportation system includes a first rail and a second rail in parallel, and wherein the first rail provides transportation for the first group and the second rail provides transportation for the second group.

16. The system of claim 15, wherein:
the local system comprises a first service area and a second service area, and wherein the first service area and the second service area are separated by an internal buffer.

17. The system of claim 16, wherein:
the first service area is configured to serve a first group of lithography apparatuses, and wherein the number of lithography apparatuses in the first group is adjustable by placing the internal buffer at a different position.

* * * * *